(12) United States Patent
Klopfer

(10) Patent No.: US 7,782,069 B2
(45) Date of Patent: Aug. 24, 2010

(54) CAPACITIVE PROXIMITY SWITCH, AND DOMESTIC APPLIANCE COMPRISING THE SAME

(75) Inventor: Wilfried Klopfer, Regensburg (DE)

(73) Assignee: BSH Bosch und Siemens Hausgerate GmbH, Munich (DE)

( * ) Notice: Subject to any disclaimer, the term of this patent is extended or adjusted under 35 U.S.C. 154(b) by 332 days.

(21) Appl. No.: 12/065,306

(22) PCT Filed: Aug. 17, 2006

(86) PCT No.: PCT/EP2006/065412

§ 371 (c)(1),
(2), (4) Date: Mar. 24, 2008

(87) PCT Pub. No.: WO2007/025871

PCT Pub. Date: Mar. 8, 2007

(65) Prior Publication Data

US 2008/0224758 A1   Sep. 18, 2008

(30) Foreign Application Priority Data

Aug. 30, 2005 (DE) ......................... 10 2005 041 109

(51) Int. Cl.
G01R 27/26 (2006.01)
(52) U.S. Cl. ..................... 324/686; 324/690; 327/517
(58) Field of Classification Search ................ 324/686, 324/690; 327/517
See application file for complete search history.

(56) References Cited

U.S. PATENT DOCUMENTS

| 4,121,204 A | 10/1978 | Welch et al. |
| 5,338,927 A * | 8/1994 | de Groot et al. ...... 250/214 VT |
| 5,917,165 A | 6/1999 | Platt et al. |
| 6,679,117 B2 * | 1/2004 | Danyluk et al. .......... 73/514.25 |
| 7,145,348 B2 | 12/2006 | Nakazaki et al. |
| 2005/0179673 A1 | 8/2005 | Philipp |

FOREIGN PATENT DOCUMENTS

| DE | 202005002157 U1 | 5/2005 |
| EP | 0858166 A1 | 8/1998 |
| EP | 0859467 A1 | 8/1998 |
| EP | 1416635 A2 | 5/2004 |
| FR | 2374811 A1 | 7/1978 |

OTHER PUBLICATIONS

International Search Report, dated Oct. 11, 2006.

* cited by examiner

*Primary Examiner*—Vincent Q Nguyen
(74) *Attorney, Agent, or Firm*—Laurence A Greenberg; Werner H Stemer; Ralph E Locher

(57) ABSTRACT

A capacitive proximity switch includes an electrically conductive sensor area, which is covered by an electrically-insulating cover plate, as part of a capacitor having a capacitance which varies as a result of proximity. An associated evaluation circuit is provided, and an electrically-conducting body, via which the sensor area is connected to the evaluation circuit and which is arranged between the electrically-insulating cover plate and a mount disposed at a distance therefrom. A domestic appliance includes such a proximity switch. At least one electronic component of the evaluation circuit is arranged on the mount such that it protrudes into a cavity, which is surrounded by the electrically conductive body.

12 Claims, 8 Drawing Sheets

CAPACITIVE PROXIMITY SWITCH, AND DOMESTIC APPLIANCE COMPRISING THE SAME

BACKGROUND OF THE INVENTION

Field of the Invention

The invention relates to a capacitive proximity switch comprising an electrically conducting sensor area which area is covered by an electrically insulating cover plate, as part of a capacitor having a capacitance which varies as a result of proximity, further comprising an associated evaluation circuit, and comprising an electrically conductive body via which the sensor area is connected to the evaluation circuit and which is disposed between the electrically insulating cover plate and a support disposed at a distance from said cover plate.

Numerous devices employing capacitive sensors or switches are known. The present invention relates to a specific configuration of capacitively operating switches, wherein an electrically conductive sensor area is covered by an electrically insulating cover plate. Thus the user does not directly touch the sensor area but only approaches said surface by touching the cover plate. The sensor area is formed by one plate of an open capacitor, the capacitance of which depends on the distance to a second plate (e.g. ground), which is changed for example by proximity of a user's finger.

Such a capacitive proximity switch is generally known from EP 0 859 467 A1. Here an electrically conductive foam body or rubber body is disposed on a board with an evaluation circuit associated with the proximity switch. The end of the electrically conductive body facing away from the board rests against the lower face of a cover plate disposed at a distance from the board, forming a sensor area there. One disadvantage of such a proximity switch is that it is susceptible to even minor interfering capacitances. Thus for example adjacent conductors, e.g. from control circuits of adjacent display devices, can appreciably interfere with the evaluation of the sensor area via the evaluation circuit, resulting in malfunctioning of the capacitive proximity switch.

BRIEF SUMMARY OF THE INVENTION

The object of the present invention is therefore to provide an improved, economical capacitive proximity switch.

This object is achieved by a capacitive proximity switch having the features of claim 1. Advantageous and preferred embodiments of the invention are set forth in the dependent claims. In a capacitive proximity switch of the type mentioned in the introduction, an electrically conducting sensor area is covered by an electrically insulating cover plate, and according to a well known principle forms a surface of a capacitor the capacitance of which varies as a result of proximity to or contact with the cover plate, which can be evaluated by an evaluation circuit. Thus the electrically insulating cover plate serves as a contact or proximity surface of the capacitive proximity switch. An electrically conductive body via which the sensor area is connected to the evaluation circuit is disposed between the electrically insulating cover plate and a support, which is disposed at a distance from said cover plate. According to the invention, the said support, which can in particular be a printed circuit board, supports at least one electronic component of the evaluation circuit in such a manner that it protrudes into a cavity which is surrounded by the electrically conductive body. The electrically conductive body forms a type of Faraday cage for the electronic component of the evaluation circuit, serving to shield said component against electromagnetic and/or capacitive interfering signals from the surroundings. This enables appreciable reduction of possible malfunctions of the proximity switch which arise from interfering signals in the surroundings.

EP 0 859 467 A1 discloses an LED disposed in a bore configured along the longitudinal axis of an electrically conducting plastic body, as a display element to identify the proximity switch. However, the sole object of the arrangement according to EP 0 859 467 A1 is to prevent scattered light from the LED entering the surroundings by means of the plastic body. Any possible shielding effect of the electrically conductive plastic body against electromagnetic and/or capacitive interfering signals is insignificant in respect of the display element, because in contrast to the evaluation circuit of the sensor area, the display element and its associated control circuit are not sensitive to such interfering signals.

Known evaluation circuits for sensor areas have an active component, e.g. a switching element, particularly in the form of a semiconductor switch. The active component has at least one signal input which is connected to the sensor area. The active component also has one signal output, the output signal of which depends on the capacitance of the capacitor formed with the sensor area, which is used to determine an actuation state of the capacitive proximity switch. This active component is particularly sensitive to electromagnetic and/or capacitive interfering signals in the surroundings. According to a preferred embodiment of the present invention, this active component of the evaluation circuit is disposed on the support in a manner such that it protrudes into the cavity which is surrounded by the electrically conductive body, such that it is shielded from the interfering signals. This has the advantage that the output signal from the active component is not subject to distortion due to interfering signals in the surroundings, thereby improving the reliability of the proximity switch overall.

In particular further electronic components associated with the active component, such as a current-limiting resistor, may be disposed on the support in a manner such that they protrude into the cavity surrounded by the electrically conductive body. Parts of the evaluation circuit which are less sensitive to the electromagnetic and/or capacitive interfering signals in the surroundings may be disposed outside the cavity surrounded by the electrically conductive body on the support or on a second support connected to the support by way of electrical conductors, being connected electrically to the component of the evaluation circuit surrounded by the electrically conductive body. This connection may be formed for example by printed conductors provided on the support.

Preferably, the lower end of the electrically conductive body facing away from the cover plate rests against an electrically conductive contact of the support and is connected to the evaluation circuit via the electrically conductive contact. Thus the lower end of the electrically conductive body extends to the support, such that the component of the evaluation circuit which is disposed on the support, together with its electrical contacts disposed on the support, is surrounded by the electrically conductive body. In particular the electrically conductive body is connected to the component of the evaluation circuit it surrounds, via the electrically conductive contact of the support, such that the associated connecting lines, which in particular are printed conductors of the support, are disposed within the cavity surrounded by the electrically conductive body. In this way, the electrical contacts of the component and the connecting lines to said component are shielded against electromagnetic interfering signals in the surroundings.

The electrically conductive body is preferably configured such that it surrounds the electronic component disposed in the cavity it surrounds over the entire extent of said component from the support in the direction of the cover plate. Advantageously the upper end of the electrically conductive body facing the cover plate rests against the lower face of the cover plate and with at least part of its surface forms at least part of the sensor area. In this way, the sensor characteristics of the proximity switch are present on the rear face of the cover plate and are transferred via the electrically conductive body to the support, without the need for an additional connecting element.

According to a preferred embodiment, a shielding surface is disposed on the rear face of the support facing away from the electrically conductive body, at least in the region of the electrically conductive body. In particular, the electrically conductive body together with this shielding surface forms a type of Faraday cage for the electronic component of the evaluation circuit disposed therein, such that it is shielded against electromagnetic interfering signals in the surroundings. In particular, the entire rear face of the support is configured as a shielding surface. In this way, the electronic component can also be shielded against power electronics disposed to the rear. The shielding surface preferably forms an active shield, in that the shielding surface and the sensor area are supplied with the most identical timing signal possible or the same timing signal at the same time. This has the advantage that no difference in potential develops between the sensor area and the shielding surface, and there is thus no shifting of charge and thus no capacitive influencing of the sensor area. This is particularly important in the case of capacitances of the capacitor formed with the sensor area in the order of picofarads, because in this capacitance range even small interfering capacitances from conductors, adjacent sensor areas or metal housings for example can affect the measurement of the capacitance of the capacitor. By minimizing the influence of such interfering capacitances on the sensor area with the aid of active shielding, it becomes possible to dispose the proximity switch near metal housing parts, even if these are grounded. Because the active shielding shields not only the sensor area but also the electronic component of the evaluation circuit surrounded by the electrically conductive body against interfering capacitances, it is possible to evaluate changes in capacitance of the capacitor formed with the sensor area reliably, since the capacitance change is not subject to distortion due to interfering signals in the surroundings.

According to a preferred embodiment, the electrically conductive body is in the form of a compression spring coiled from an elongated body, said elongated body preferably being a spring wire with a round or rectangular cross section, from which the compression spring can be easily wound. This compression spring enables differing distances between the cover plate and the support to be bridged, in that the compression spring is compressed to differing degrees. Because the metallic spring wire is highly conductive, it provides particularly good shielding against electromagnetic interfering fields.

Preferably the compression spring is cylindrical in shape, at least in a sub-region at its end facing the support. In this way, it is possible to achieve uniform shielding against electromagnetic interfering signals in the surroundings over the entire extent of the electronic component surrounded by the compression spring coaxial to the compression spring. Also, even when the compression spring is fully compressed, this arrangement reliably prevents contact between the coils of the compression spring and the electronic component disposed inside the compression spring.

It is particularly advantageous if the compression spring has a conically shaped sub-region adjoining the cylindrical region at its end facing away from the support, so that the spring excursion of the compression spring thus achieved is greater than that of a strictly cylindrical compression spring. Preferably, the coil diameter decreases from the cylindrical sub-region in the direction of the cover plate, such that the component disposed inside the compression spring is also shielded against electromagnetic and/or capacitive interfering signals coming from the direction of the cover plate.

According to an alternative embodiment, the electrically conductive body is an inherently elastic hollow body, particularly made of conductive plastic. This electrically conductive plastic body has a central bore, which extends axially through the entire the plastic body in the direction from the support to the cover plate. The electronic component of the evaluation circuit is disposed on the support in a manner such that it protrudes into said bore and is surrounded by the plastic body and shielded from interfering signals.

Advantageously, an illuminating element, e.g. an LED, an incandescent lamp, or an optical waveguide, is disposed on the support and protrudes into the cavity surrounded by the electrically conductive body, and/or is disposed in a region defined by the sensor area. This illuminating element may serve to identify the sensor area or to signal various switching states of the proximity switch. Also, a marking may be provided, e.g. in the form of a printed image, on the upper face of the cover plate or on its lower face, if the cover plate is transparent, for purposes of identifying the position of the sensor area.

Preferably at least one inventive proximity switch is provided in or on a domestic appliance or an input field for a domestic appliance, such as a washing machine, tumble dryer, dishwasher, cooking appliance, extractor hood, refrigerator, air conditioner, water heater, or vacuum cleaner. Thus the domestic appliance may be fitted with a standard cover panel encompassing the input field, so that the domestic appliance is protected against ingress of dirt and moisture. The cover panel here corresponds to the electrically insulating cover plate and may be made of glass, glass ceramic, ceramic, plastic, wood, or stone, for example.

It should be noted that the features of the subclaims can be combined with each other in any way without deviating from the idea according to the invention.

BRIEF DESCRIPTION OF THE SEVERAL VIEWS OF THE DRAWING

The invention is described in more detail below, with reference to the drawings, in which.

DESCRIPTION OF THE INVENTION

Figure 1:
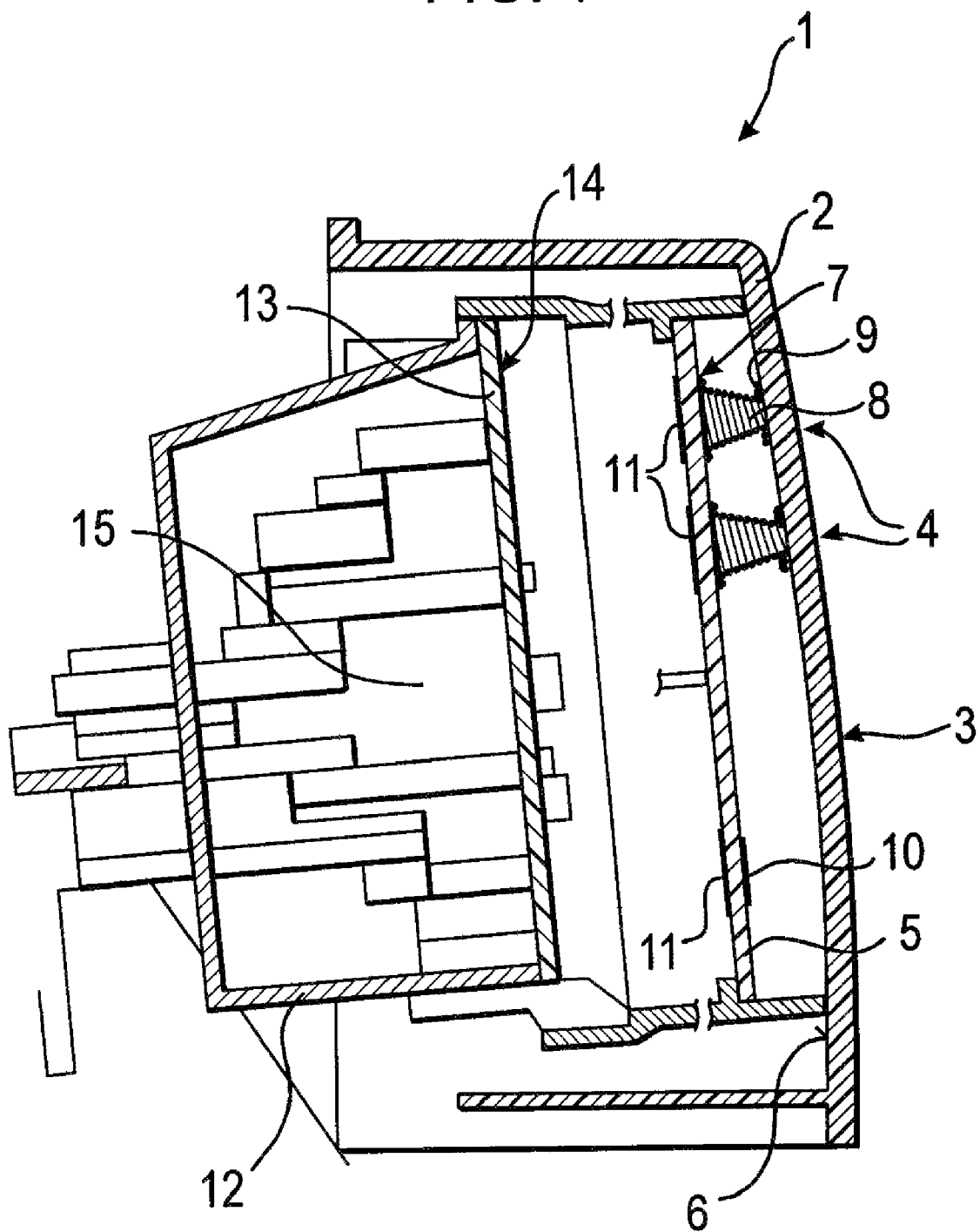
FIG. 1 shows a schematic cross sectional view of a segment of a domestic appliance having a cover panel, which has an inventive input field.

Before proceeding to the description of the drawings, it should be noted here that identical reference characters have been used to represent corresponding or identical elements or individual parts in the various embodiments of the inventive capacitive proximity switch in all the figures. Where a plurality of elements or individual parts of the same type are used in a drawing and it is sought to differentiate between them, (an) identical figure(s) is/are respectively selected for the initial digit(s) of the corresponding reference character. The subsequent digits serve to distinguish elements or individual parts of the same type.

FIG. 1 shows a schematic cross sectional view of a segment of a domestic appliance 1 with a cover panel 2 which has an inventive input field 3. The cover panel 2 is an electrically insulating cover plate made of a dielectric material, e.g. glass, glass ceramic, ceramic, plastic, wood, or stone or the like. The input field 3 contains a plurality of capacitive proximity switches 4 of like structure, of which only two are shown here and of which only one is described below. A printed board 5 with an electrically conductive sensor area 7 facing the rear face 6 of the cover panel 2 is disposed at a distance from the cover panel 2. The printed board 5 may be a plastic board, which has the abovementioned sensor area 7, and optionally printed conductors for electrically conducting connection of the sensor area 7 to an electrical circuit 14 of the proximity switch 4 (see FIGS. 4, 5 and 6), on at least one of its board faces. The electrically conducting layer of the sensor area 7 may be configured in various shapes and forms, for example circular or square, continuous, lattice or frame-like.

An electrically conductive body in the form of a coiled compression spring 8, preferably made of spring wire, is disposed between the cover panel 2 and the printed board 5. The compression spring 8 has a flat coil disk 9 at its upper end, consisting of a plurality of coils, which are spirally nested and positively tailored to the slightly arched shape of the rear face of the cover panel 2. On its lower end, the compression spring 8 has a lower coil 9', with which it rests flatly against the sensor area 7 of the printed board 5 and is for example soldered or adhesively bonded to the sensor area 7 of the printed board 5 there or with which it rests firmly against the sensor area 7 of the printed board 5 only due to compressive stress, so that there is an electrically conducting connection between the compression spring 8 and the sensor area 7 of the printed board 5. Through this electrically conducting connection, the sensor characteristics of the sensor area 7 are transferred from the printed board 5 to the rear face 6 of the cover panel 2 and the compression spring 8 for its part then forms at least a part of the sensor area 7, particularly with its coil disks (9, 9'). The electrically conductive body may have other forms, e.g. cylindrical, conical, or rectangular and/or may be configured from other electrically conductive materials, e.g. electrically conductive plastic or a plastic with a metallic core, instead of being a coiled metal compression spring 8.

An electrically conducting reference sensor area 10 is disposed on the same side of the printed board 5 on which the sensor area 7 is disposed, in other words on the front face of the printed board 5 facing the rear face 6 of the cover panel 2). Like the sensor area 7, the reference sensor area 10 is connected in an electrically conductive manner to the circuit 14 of the proximity switch 4. An associated reference sensor area 10 may be provided for each of the sensor areas 7 or a common reference sensor area 10 may be provided for a plurality or all of the sensor areas 7. In contrast to the sensor area 7, the reference sensor area 10 lacks the electrically conductive compression spring 8, thus the reference sensor area 10 is electrically insulated with respect to electrical charges and charge changes on the front face of the cover panel 2, by the air layer between the printed board 5 and the cover panel 2.

Figure 2:
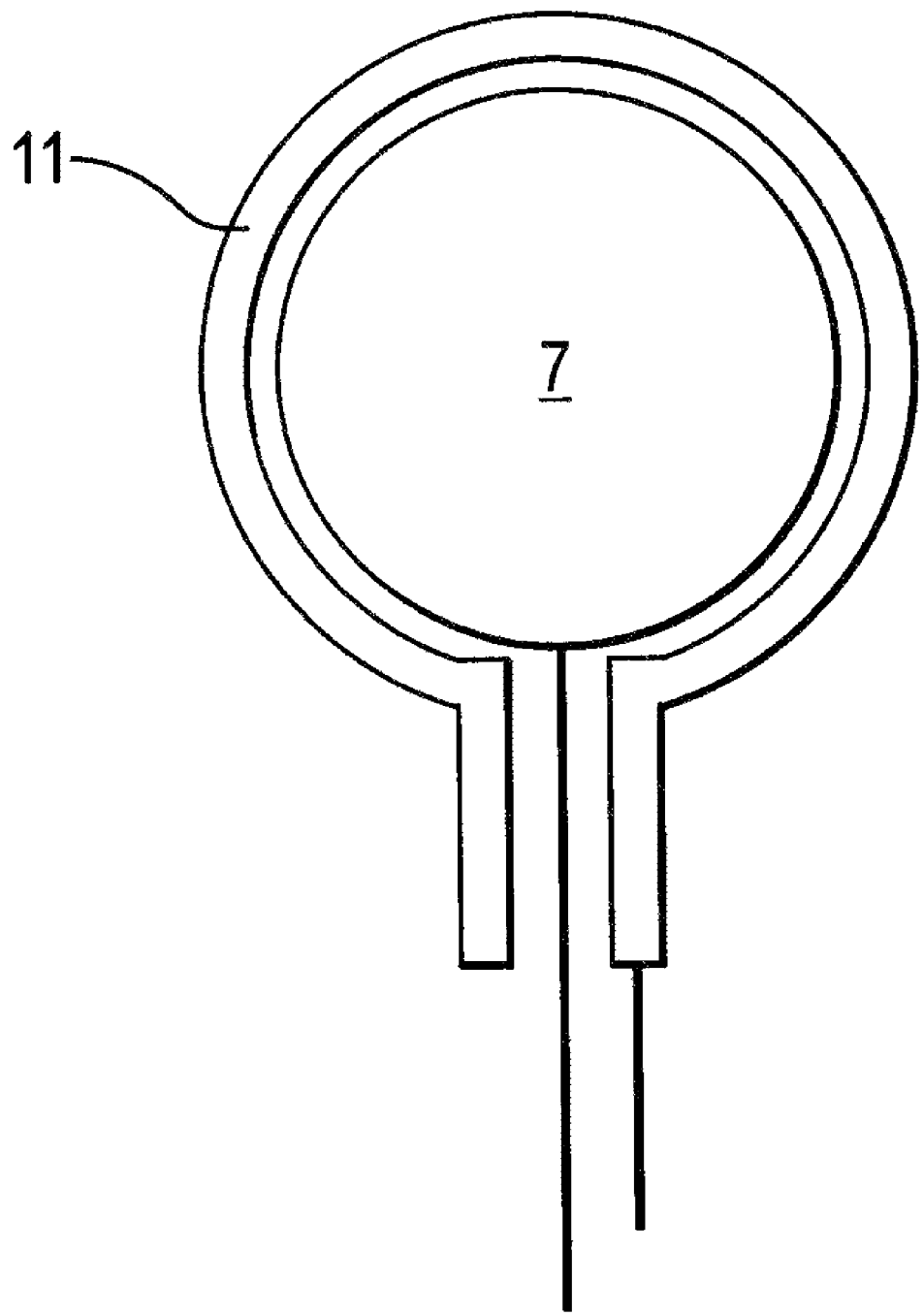
FIG. 2 shows a schematic front view of an embodiment of a sensor area with a shielding surface framing the sensor area.

An electrically conductive shielding surface 11 is disposed on the rear face of the printed board 5, at the position of the sensor area 7 and/or the reference sensor area 10, its mode of operation being described below in connection with FIG. 5. Instead of individual shielding surfaces 11 for each sensor area 7 or reference sensor area 10, a single shielding surface may be provided, which extends over the entire rear face of the printed board 5 or which at least covers the region on the rear face of the printed board 5, which comprises the sensor areas 7 or reference sensor areas 10. In particular, the printed board 5 may comprise a flexible printed board or a copper-clad plastic film. According to a further alternative embodiment shown FIG. 2, the sensor area 7, which is circular here, and the shielding surface 11 are both being located on the front face of the printed board 5. The shielding surface 11 here is formed by an electrically conductive layer which surrounds the sensor area 7 in the manner of a frame, the form of said frame being tailored to the outer contour of the sensor area 7.

The electrical circuit 14 of the proximity switch 4 may be disposed on the front face or rear face of the printed board 5, or on a separate board. A common circuit 14 may be provided for a plurality of, or all of, the proximity switches 4. In the embodiment illustrated in FIG. 1, an electronics module 12 is disposed behind the printed board 5, having a board 13, which has the circuit 14 of the proximity switch 4 on its front face facing the printed board 5 and is fitted with the power electronics 15 of the domestic appliance 1 on its rear face. This board 13 is electrically connected to the printed board 5 (not shown).

Figure 3A:
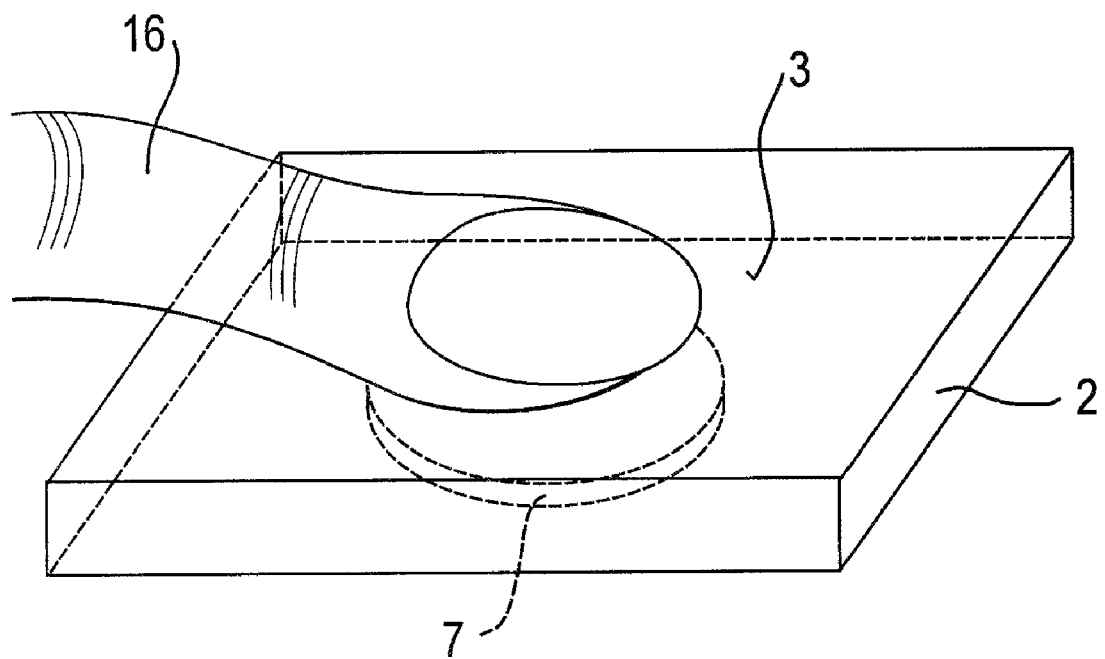
FIGS. 3a and 3b show schematic views of a segment of the input field according to FIG. 1, with actuation of an inventive capacitive proximity sensor by a user.
Figure 3B:
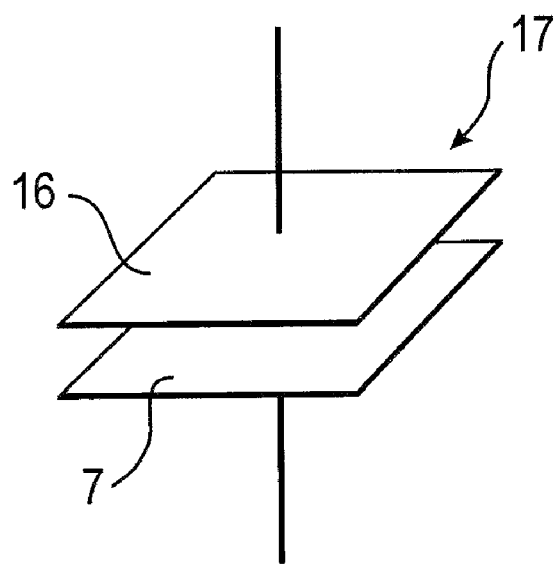

If an element, e.g. a user's finger 16 as shown by way of example in FIG. 3a, which has a potential different from the potential of the sensor area 7, in particular ground potential, is brought close to or in contact with the surface region of the cover panel 2 opposite the sensor area 7, this causes a change in the capacitance of a capacitor 17 formed from the element in question or the finger 16, the cover panel 2, and the sensor area 7 or the sensor area 7 together with the compression spring 8, see FIG. 3b. Because the sensor area 7 is connected in an electrically conductive manner to the circuit 14 of the proximity switch 4, the change in capacitance can be determined by the circuit 14 and can be further used to trigger a switching signal, as described in more detail below. Further, a light source 35 (see FIG. 8), e.g. an LED may be provided on the printed board 5 in the region inside the compression spring 8 in order to identify the sensor area 7 or to signal different switching states of the proximity switch 4.

Figure 4:
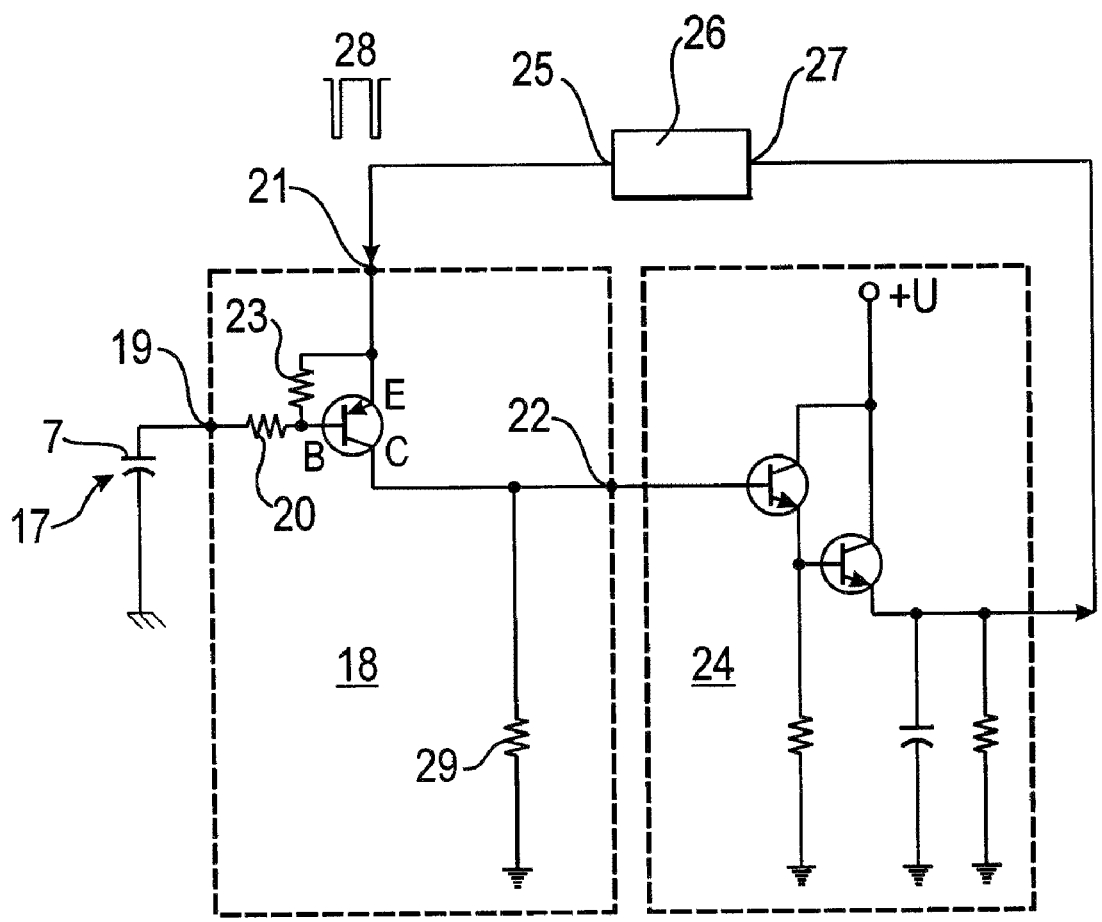
FIG. 4 shows a segment of a schematic electrical circuit diagram of the inventive capacitive proximity switch.

FIG. 4 shows a segment of a circuit diagram of the electrical circuit 14, which has a semiconductor switch 18 in the form of a bipolar PNP transistor, to whose control input 19, in other words to whose base, the sensor area 7 is connected via a current-limiting resistor 20. The semiconductor switch 18 further has a signal input 21, i.e. the emitter of the bipolar PNP transistor, and a signal output 22, i.e. the collector of the bipolar PNP transistor, the signal input being connected to the sensor area 7 via a base-emitter resistor 23. The current-limiting resistor 20 and the base-emitter resistor 23 may be pre-integrated into the bipolar PNP transistor. The signal output 22 of the semiconductor switch 18 is connected to a sample and hold stage 24 of known type, for further processing of an output signal. This arrangement enables generation of a direct voltage signal proportional to the amplitude of the pulse peaks of the output signal and will not be further described here. As an alternative to the sample and hold stage 24, the signal output 22 of the semiconductor switch 18 may be connected to a known integrator circuit or a known peak voltage meter (not shown), for processing of the output signal. The signal input 21 of the semiconductor switch 18 is connected to an analog signal output 25 of a microprocessor 26, and the signal output 22 of the semiconductor switch 18 is connected to an analog signal input 27 of the microprocessor 26 via the sample and hold stage 24. Instead of the single microprocessor 26, two different microprocessors may also be used, one of which is connected to the signal input 21 of the semiconductor switch 18 and the other to the signal output 22 of the semiconductor switch 18. Alternative semiconductor switches 18 may be used, instead of the bipolar PNP transistor, for example a bipolar NPN transistor, field effect transistors (FETs), or generally any controllable semiconductor elements.

A timing signal 28 is applied to the signal input 21 of the semiconductor switch 18, being supplied for example by the analog signal output 25 of the microprocessor 26. The timing signal 28 is a periodic square wave voltage signal which is switched regularly by the microprocessor 26 between ground potential, i.e. LOW level and the operating voltage of the circuit 14 of the proximity switch 4, i.e. HIGH level, it being possible for ground potential to differ from the ground potential of the user. The timing frequency of the timing signal 28 is preferably in the range 10-100 kHz. The signal output 22 of the semiconductor switch 18, in other words the collector of the bipolar PNP transistor, is at the reference potential of the sample and hold stage 24 via another resistance 29. When the timing signal 28 is at the LOW level, the signal input 21 of the semiconductor switch 18 and thus the emitter E of the bipolar PNP transistor, and the base-emitter resistor 23 is at ground potential. This causes the sensor area 7 and/or the capacitor 17 to be discharged via the current-limiting resistor 20 and the base-emitter resistor 23. This means that the base B of the bipolar PNP transistor is positive with respect to the emitter E of the bipolar PNP transistor, and thereby blocks the bipolar PNP transistor. The HIGH level of the timing signal 28 following the LOW level results in the charging of the sensor area 7 and therefore the capacitor 17 via the base-emitter resistor 23 and current-limiting resistor 20. During this time of charging the sensor area 7 and/or the capacitor 17, there is a voltage drop at the base-emitter resistor 23. This means that the base B of the bipolar PNP transistor is negative with respect to the emitter E and the bipolar PNP transistor becomes conducting, and thus in the switching state, until the sensor area 7 and/or the capacitor 17 becomes charged to the HIGH level of the timing signal 28. During this charging time of the sensor area 7 and/or the capacitor 17, an output signal is applied to the resistor 29, via the timing signal 28, which is proportional to the capacitance of the sensor area 7 and/or the capacitor 17. Thus an output signal is applied to the signal output 22 of the semiconductor switch 18, which follows the timing signal 28, and whose signal parts are proportional to the capacitance of the sensor area 7 and/or the capacitor 17.

This output signal is converted to a direct voltage signal by means of the sample and hold stage and is applied to the analog signal input 27 of the microprocessor 26. The microprocessor 26 is configured to evaluate a temporal change in the signal parts of the direct voltage signal and thus of the output signal, e.g. with the aid of a software program. Depending on how rapidly the signal parts of the output signal, e.g. the height of the pulse peaks or the pulse widths of successive timing periods change, the microprocessor 26 can recognize an actuation of the proximity switch 4. In other words, if the signal parts change within a predetermined time period of for example 1 second, this is recognized as an actuation, but if the signal parts change more slowly, there is no actuation. In this way, the determination of an actuation of the proximity switch 4 does not depend on the absolute size of the output signal, with the result that long-term changes, e.g. due to aging processes, are eliminated.

Figure 5:
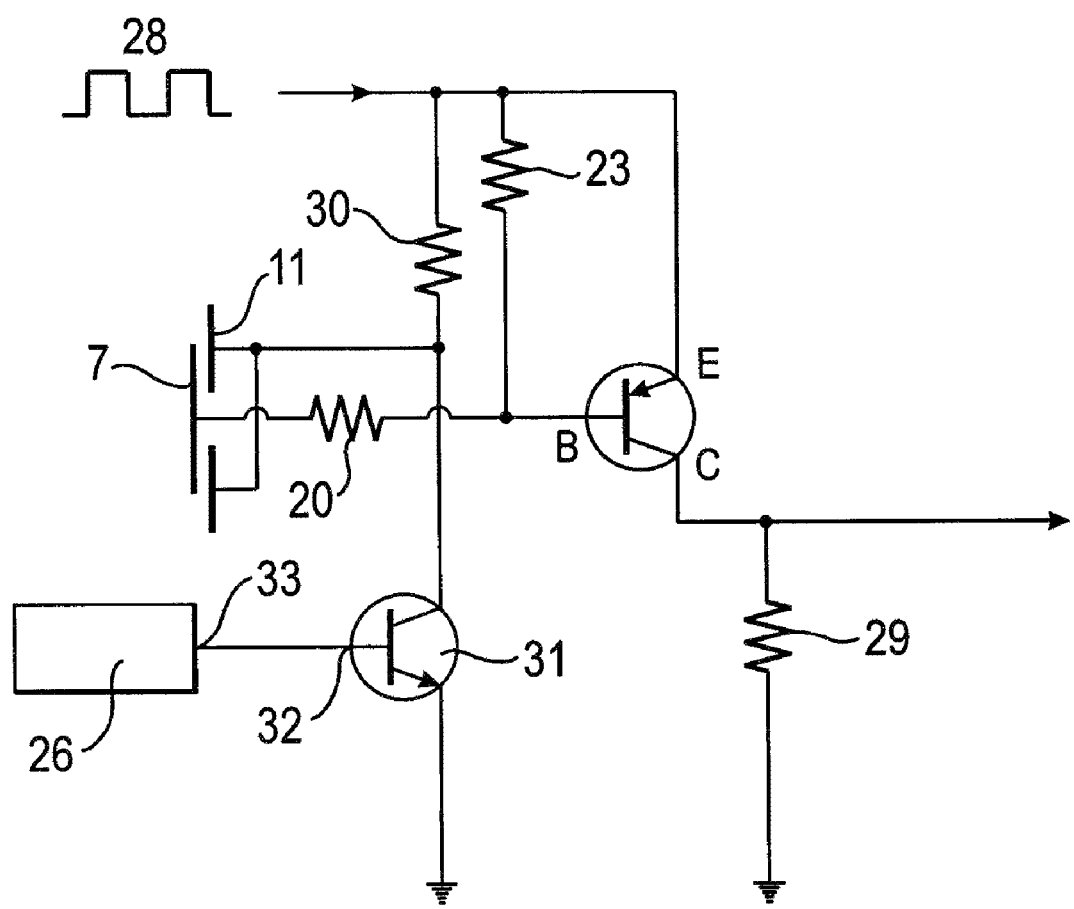
FIG. 5 shows a segment of a schematic electrical circuit diagram of the inventive capacitive proximity switch, having active shielding.

FIG. 5 shows a segment of the electrical circuit 14 of the inventive proximity switch 4, having active shielding. The active shielding is formed by the shielding surface 11, which is connected via a low-resistance resistor 30 to the signal input 21 of the semiconductor switch 18 and to which the timing signal 28 is applied via said low-resistance resistor 30 at the same time as to the sensor area 7. By appropriate choice of the low-resistance resistor 30, the signal form of the timing signal 28 at the shielding surface 11 can be adjusted to the signal form of the timing signal 28 at the sensor area 7, so that there is no potential difference and thereby no shifting of charge carriers between the shielding surface 11 and the sensor area 7, thereby ensuring that the shielding surface 11 shields the sensor area 7 against interfering capacitances.

In order to apply ground potential, the shielding surface 11 is connected to ground via a switch 31 which is a bipolar NPN transistor in the embodiment illustrated. The switch 31 has a control signal input 32, namely the base of the bipolar NPN transistor, which is connected to a control signal output 33 of the microprocessor 26. Thus the switch 31 or the bipolar NPN transistor can be switched in a simple manner by a software program of the microprocessor 26. For function testing of the proximity switch 4, i.e. to determine the reference value of the output signal, the shielding surface 11 is temporarily connected to ground potential via the switch 31, as a result of which the active shielding is temporarily neutralized, and actuation of the proximity switch 4 is simulated. This enables a test of whether the output signal is shifted sufficiently when the proximity switch 4 is actuated, or whether there is a malfunction, which may be attributable for example to dirt or moisture on the cover panel 2 or ambient conditions such as temperature and humidity or aging processes of the proximity switch 4. In some instances the signal shift of the output signal can be dynamically adjusted by changing the amplitude of the timing signal 28, i.e. the proximity switch 4 can be automatically calibrated, as a result of which the functional reliability of the proximity switch 4 is improved. If the reliable functioning of the proximity switch 4 is no longer ensured, as a result for example of a soiled cover panel 2, the domestic appliance 1 is automatically shut off.

The reference sensor area 10 is connected correspondingly to the sensor area 7. The reference sensor area 10 is disposed adjacent to the sensor area 7, so that the capacitance of the reference sensor area 10 or of an open reference capacitor formed with the reference sensor area 10 is a measure of ambient conditions, in other words interfering capacitances, and is also a measure of the influence of temperature, humidity, or aging-related material changes, on the output signal. The same timing signal 28 is applied to the reference sensor area 10 as to the sensor area 7, preferably in a time-multiplex method. In other words the sensor area 7 and the reference sensor area 10 are supplied in sequence, with different periods of the same timing signal 28. Alternatively, a further timing signal from a further analog signal output of the microprocessor 26 may also be applied to the reference sensor area 10. The reference signal generated by the reference sensor area 10 is considered as a base level of the output signal during the evaluation, in the microprocessor 26, of the output signal generated by the sensor area 7, and thus serves to determine the actuation state of the proximity switch 4. In the case of domestic appliances 1, which are connected using a power mains switch, as soon as the power is turned on, the reference signal is utilized to determine whether the proximity switch 4 is being actuated.

Figure 6:
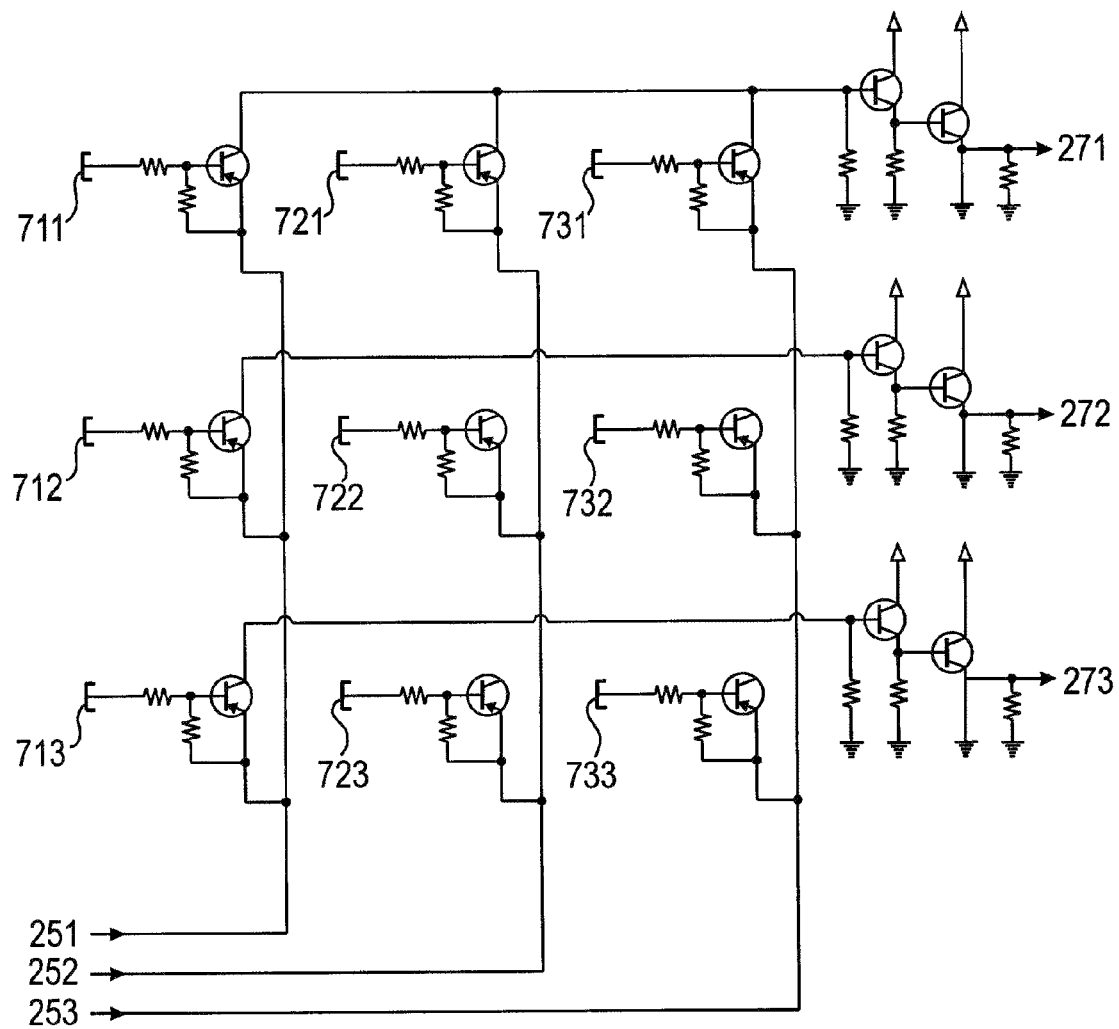
FIG. 6 shows a schematic electrical circuit diagram of the input field according to FIG. 1, with a plurality of inventive proximity switches connected in a matrix array.

FIG. 6 shows a schematic circuit 14 of the input field 3, with nine inventive proximity switches 4 connected in a 3×3 matrix for operation using a time-multiplex method. The sensor areas 711, 712, 713 of the first three proximity switches are connected to a first signal output 251 of the microprocessor 26. The sensor areas 721, 722, 723 of the second group of three proximity switches are connected to a second signal output 252 of the microprocessor 26. The sensor areas 731, 732, 733 of the third group of three proximity switches are connected to a third signal output 253 of the microprocessor 26. The sensor areas 711, 721, 731 are connected to a first signal input 271 of the microprocessor 26 via their respectively associated semiconductor switches and a first sample and hold stage. The sensor areas 712, 722, 732 are connected to a second signal input 272 of the microprocessor 26 via their respectively associated semiconductor switches and a second sample and hold stage. The sensor areas 713, 723, 733 are connected to a third signal input 273 of the microprocessor 26 via their respectively associated semiconductor switches and a third sample and hold stage.

The timing signal 28 is output from one of the three signal outputs 251, 252, 253 of the microprocessor 26 respectively for a predetermined time interval, i.e. a predetermined number of timing periods. The signal outputs 251, 252, 253 are alternated in sequence, with cyclic repetition of the sequence. In the time interval in which the timing signal 28 is output from one of the three signal outputs 251, 252, 253, each of the three signal inputs 271, 272, 273 of the microprocessor is respectively evaluated. In this way it is possible to check all nine sensor areas 711, 712, 713, 721, 722, 723, 731, 732, 733 one after the other to determine whether a user is actuating the corresponding proximity switch using just one circuit.

Figure 7:
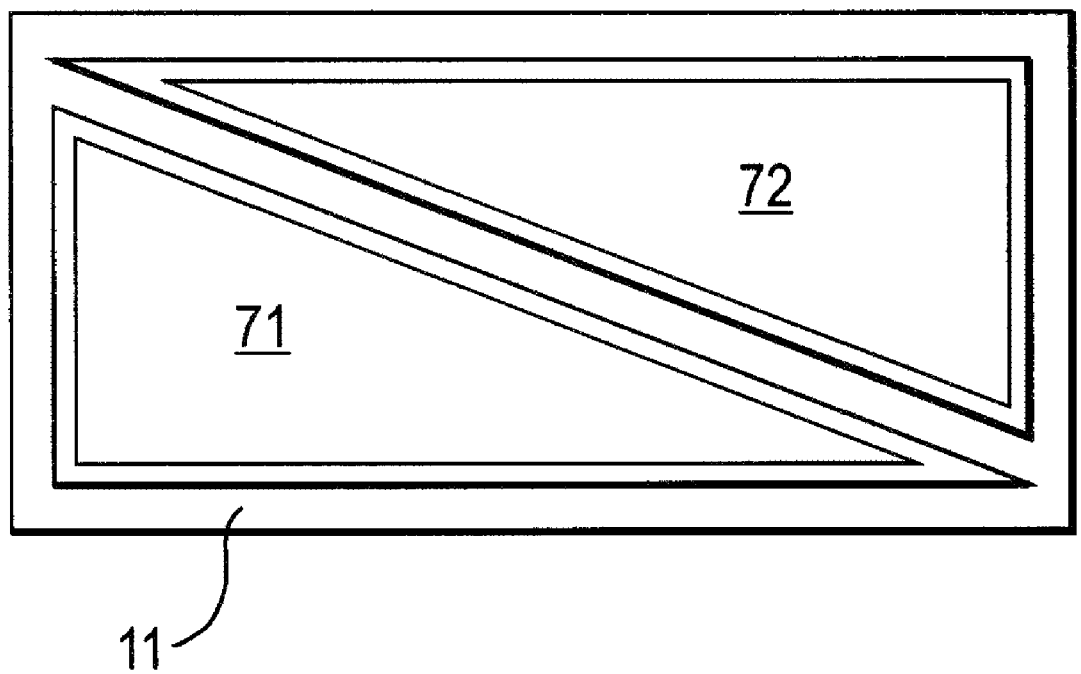
FIG. 7 shows a schematic front view of an embodiment of two sensor areas which form a position sensor.

FIG. 7 shows a schematic front view of an embodiment of two sensor areas 71, 72 which together form a position sensor. The sensor areas 71, 72 are configured as right-angled triangles and are disposed close to each other on a common support 5 or on the rear face of the cover panel 2, with the sensor areas 71 and 72 with their respective hypotenuses facing each other. The sensor areas 71, 72 are surrounded by a common shielding surface 11, which extends along the hypotenuses of the triangles between the sensor areas 71, 72. Depending on the position relative to the lateral extension of the sensor areas 71, 72 in which actuation is carried out by the user, in that the user touches the cover panel 2 in the region of the sensor area 71, 72 and therefore of the position sensor, the capacitances of the capacitors formed with the sensor areas 71, 72 are different due to the triangular shapes of the sensor areas 71, 72. The position of the actuation can thus be determined based on the output signals associated with the sensor areas 71, 72 and a switching state corresponding to or associated with such position can be triggered. If the actuating position is changed or shifted, in that the user for example moves a finger on the cover panel 2, this change is likewise detected and a switching state corresponding to the new position can be triggered. Thus the position sensor forms a slide switch without mechanically moving elements. Such a switch may be used, e.g., to set a temperature or power setting on a hob, air conditioner, or refrigerator.

Figure 8:
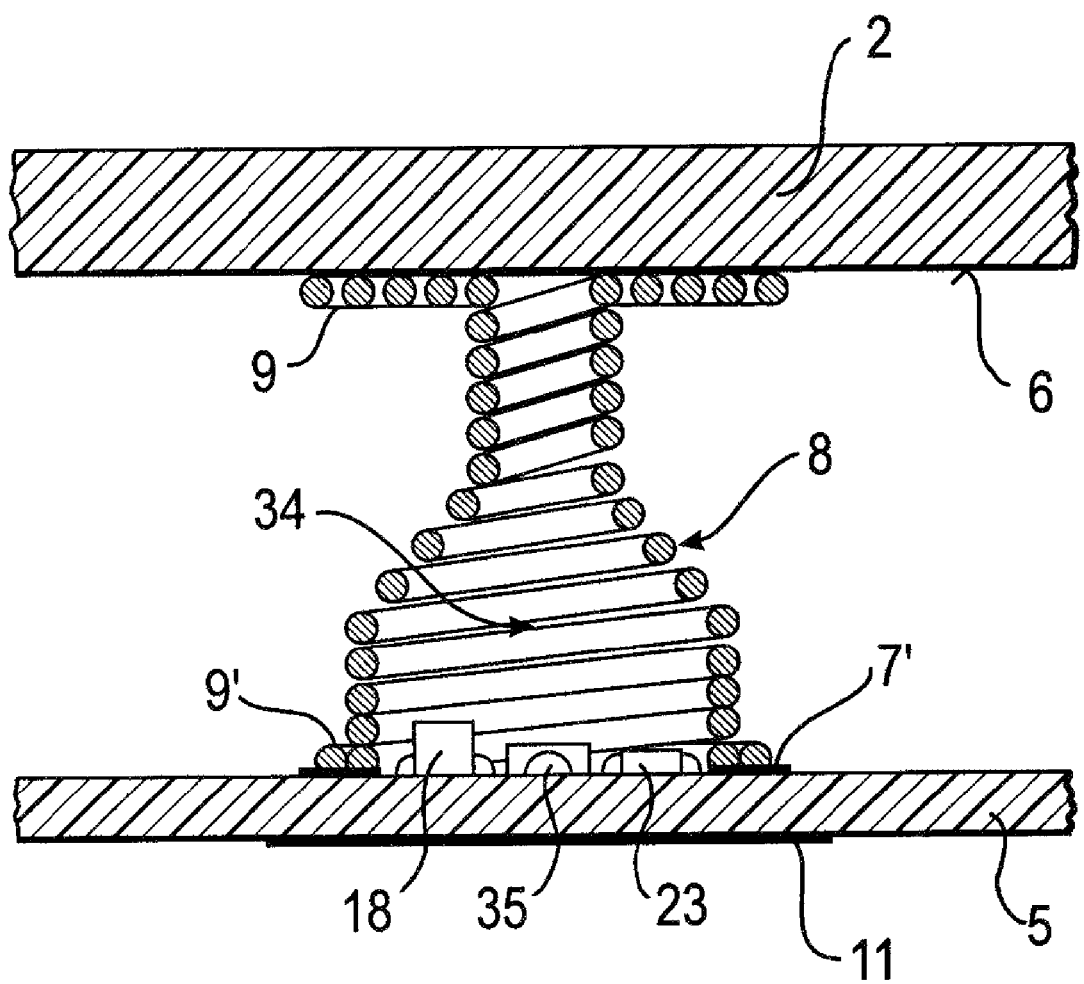
FIG. 8 shows a schematic cross sectional view of a segment of the input field according to FIG. 1, with electronic components of the electrical circuit according to FIG. 4 which protrude into a cavity surrounded by a compression spring.

FIG. 8 shows a schematic cross sectional view of a segment of the input field according to FIG. 1. A solder ring 7' is applied to the printed board 5, with which the coil disk 9' formed by the lower two coils of the coiled compression spring 8 is soldered to the printed board 5 and is thereby connected to the electrical circuit 14. The coils of the compression spring 8 surround a cavity 34. On the printed board 5, inside the solder ring 7', on the side of the electronic components of the electrical circuit 14 which faces the cover plate 2, there are disposed the bipolar PNP transistor of the semiconductor switch 18, with its base-emitter resistor 23 and its current-limiting resistor 20, as well as a light-emitting diode 35, which protrude into the cavity 34 surrounded by the compression spring 8. In order to allow electrical connection of these electronic components to the other components of the electrical circuit 14, the solder ring 7' is not completely closed but is laterally interrupted (not shown). Alternatively, the electrical connection can also be realized through the printed board 5. Together with the shielding surface 11 disposed on the rear face of the printed board 5, the compression spring 8 forms a Faraday cage for the electronic components disposed in the interior region 34 of the compression spring 8, so that these are shielded from electromagnetic fields in the surroundings.

From the coil disk 9', the compression spring 8 has a cylindrical sub-region 36, in which the coil diameter is constant. This is followed (in the direction from the printed board 5 toward the cover plate 2) by a truncated cone-shaped sub-region 37, in which the coil diameter decreases in the direction toward the cover plate. In this manner, the electronic components are also shielded against electromagnetic and/or capacitive interfering signals from the direction of the cover plate. The compression spring 8 is generally coiled as a single piece from metal spring wire. The compression spring 8 may also be made from other electrically conductive materials, e.g. electrically conductive plastic, or plastic with a metallic core, in the form of an injection-molded plastic part. An electrically conductive body may also be employed which is not in the form of a compression spring but is an inherently elastic solid body made of conductive plastic (not shown), which has a recess or continuous bore to hold the electronic components at its end facing the printed board 5.

The invention claimed is:

1. A capacitive proximity switch, comprising:
an electrically conducting sensor area and an electrically insulating cover plate covering said sensor area and forming part of a capacitor with a capacitance that changes upon being approached;
a support disposed at a spacing distance from said electrically insulating cover plate;
an evaluation circuit;
an electrically conductive body connecting said sensor area with said evaluation circuit and being disposed between said electrically insulating cover plate and said support; and
at least one electronic component of said evaluation circuit disposed on said support and protruding into a cavity surrounded by said electrically conductive body.

2. The proximity switch according to claim 1, wherein said at least one component is an active component of said evaluation circuit.

3. The proximity switch according to claim 2, wherein said active component is a switching element.

4. The proximity switch according to claim 1, wherein said electrically conductive body has a lower end facing away from said cover plate, and wherein said lower end rests against an electrically conductive contact of said support and is connected to said evaluation circuit via said electrically conductive contact.

5. The proximity switch according to claim 1, wherein said electrically conductive body has an upper end facing said cover plate and bracing against a lower face of said cover plate, and wherein at least a part of a surface of said conductive body forms at least part of said sensor area.

6. The proximity switch according to claim 1, which comprises a shielding surface disposed on a rear face of said support opposite said electrically conductive body, said shielding surface being disposed at least in a region opposite said electrically conductive body.

7. The proximity switch according to claim 1, wherein said electrically conductive body is a compression spring coiled from an elongated body.

8. The proximity switch according to claim 7, wherein said compression spring is substantially cylindrical in shape at an end thereof facing said support, at least in a cylindrical sub-region thereof.

9. The proximity switch according to claim 8, wherein said compression spring includes a conical sub-region adjoining said cylindrical sub-region at an end thereof facing away from said support.

10. The proximity switch according to claim 1, wherein said electrically conductive body is an inherently elastic hollow body.

11. An input panel for a domestic appliance, comprising at least one proximity switch according to claim 1.

12. A domestic appliance, comprising an input panel with at least one proximity switch according to claim 1.

* * * * *